(12) United States Patent
Nakano et al.

(10) Patent No.: US 7,970,569 B2
(45) Date of Patent: Jun. 28, 2011

(54) APPARATUS AND METHOD FOR CONNECTION TEST ON PRINTED CIRCUIT BOARD

(75) Inventors: Kazuharu Nakano, Kawasaki (JP); Mikiko Kikuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 139 days.

(21) Appl. No.: 12/411,060

(22) Filed: Mar. 25, 2009

(65) Prior Publication Data

US 2009/0182523 A1 Jul. 16, 2009

Related U.S. Application Data

(63) Continuation of application No. PCT/JP2006/321724, filed on Oct. 31, 2006.

(51) Int. Cl.
*G01R 31/00* (2006.01)
(52) U.S. Cl. ......... 702/120; 702/117; 702/118; 702/122
(58) Field of Classification Search .................. 702/65, 702/66, 100, 106, 117, 120, 176, 189, 190; 710/35; 714/30, 727, 730, 736, 744
See application file for complete search history.

(56) References Cited

U.S. PATENT DOCUMENTS

| | | | | |
|---|---|---|---|---|
| 4,947,395 A * | 8/1990 | Bullinger et al. | ............. | 714/730 |
| 5,115,435 A * | 5/1992 | Langford et al. | ............. | 714/727 |
| 5,410,551 A * | 4/1995 | Edwards et al. | ............. | 714/736 |
| 5,428,626 A * | 6/1995 | Frisch et al. | .................. | 714/744 |
| 5,911,039 A | 6/1999 | Hashizume | | |
| 6,925,583 B1 * | 8/2005 | Khu et al. | ........................ | 714/30 |
| 7,017,087 B2 | 3/2006 | Panis et al. | | |
| 7,334,060 B2 * | 2/2008 | Bybell | ............................. | 710/35 |
| 7,613,968 B2 | 11/2009 | Ishikawa | | |

FOREIGN PATENT DOCUMENTS

| | | |
|---|---|---|
| JP | 3-65670 A | 3/1991 |
| JP | 10-170606 | 6/1998 |
| JP | 10-186006 A | 7/1998 |
| JP | 11-052025 A | 2/1999 |
| JP | 11-174122 A | 7/1999 |
| JP | 2001-4683 | 1/2001 |
| JP | 2001-344988 A | 12/2001 |
| JP | 2003-057301 A | 2/2003 |
| JP | 2004-205351 | 7/2004 |

(Continued)

OTHER PUBLICATIONS

International Search Report of PCT/JP2006/321724, Mailing Date of Apr. 10, 2007.

(Continued)

*Primary Examiner* — Michael P Nghiem
*Assistant Examiner* — Felix E Suarez
(74) *Attorney, Agent, or Firm* — Fujitsu Patent Center

(57) ABSTRACT

A connection test apparatus includes a controlling section, controlling each connection test device to switch the operation mode between the first and the second modes such that a first connection test device among the connection test devices is in the first mode and the remaining connection devices are in the second mode, and controlling a signal generating circuit to output the connection test signal; and a judging section judging, on the basis of the response signal that the first connection test device outputs in response to the connection test signal, a state of connection of a first connector connected to the first connection test device and a first net including the first connector among the nets.

18 Claims, 8 Drawing Sheets

FOREIGN PATENT DOCUMENTS

| | | |
|---|---|---|
| JP | 2004-525546 | 8/2004 |
| JP | 2005-249494 A | 9/2005 |
| JP | 2006-220515 | 8/2006 |
| JP | 2007-10552 A | 1/2007 |
| WO | WO-02-54240 | 7/2002 |

OTHER PUBLICATIONS

"Japanese Office Action" mailed by JPO and corresponding to Japanese application No. 2008-541939 on Feb. 1, 2011, with English translation.

* cited by examiner

APPARATUS AND METHOD FOR CONNECTION TEST ON PRINTED CIRCUIT BOARD

CROSS REFERENCE TO RELATED APPLICATION(S)

This application is continuation of an International Application No. PCT/JP2006/321724 which was filed on Oct. 31, 2006, in Japan, which is herein incorporated by reference.

TECHNICAL FIELD

The embodiments discussed herein relate to an apparatus and a method for a connection test to be performed on a printed circuit board with a number of elements, and more particularly relate to an apparatus and a method for a connection test on a printed circuit board with a number of connectors.

BACKGROUND

In accordance with recent enhancement in integration of chip elements such as an LSI (Large Scale Integration), a more complex circuit has been able to be mounted on a smaller chip.

In addition, development in a technique to mount elements onto the surface of a printed circuit board can mount an increased number of chip elements onto the printed circuit board.

It is sure that the above has realized the construction of a system small in size and high in performance, but on the other hand, such a system has a difficulty in testing each of the chip elements mounted on the printed circuit board.

As a solution to a test for a highly-integrated printed circuit board, JTAG (Joint Test Action Group) has proposed a method for a board connection test (i.e., a method for simplifying a connection test) confirming to the IEEE 1149.1 standard. This method for a board connection test defines the boundary scan architecture (hereinafter a JTAG circuit) serving as a connection test mechanism that is to be incorporated into a chip elements exemplified by an LSI.

Such a JTAG circuit is connected to a shifting scan chain formed by connecting input/output pins of chip elements on the printed circuit board, so that the state of the input/output pins can be controlled and observed only through scanning and shifting operations without directly probing the inputting/outputting pins.

Further, a JTAG circuit is used for a test for a printed circuit board on which a chip element on which the JTAG circuit has been mounted, which test is exemplified by a connection test between electronic elements connected to the printed circuit board via a connector and the chip element including the JTAG circuit (see below Patent References 1-4).

[Patent Reference 1] Japanese Patent Application Laid-Open No. HEI 11-174122
[Patent Reference 2] Japanese Patent Application Laid-Open No. 2003-57301
[Patent Reference 3] Japanese Patent Application Laid-Open No. HEI 10-186006
[Patent Reference 4] Japanese Patent Application Laid-Open No. HEI 11-52025

Recent development in a technique to mount elements onto the surface of a printed circuit board enables a single LSI to be connected to a large number of electronic elements via connectors. That requires one-to-many connection tests in addition to one-to-one tests disclosed in the above Patent References 1-4.

For example, for a printed circuit board 104 to be tested which includes, as depicted in FIG. 6, an LSI 101 with a JTAG circuit 100 and a number of connectors 103a-103d to which electronic elements 102a-102d (e.g., a memory element or another printed circuit board) connected to the LSI 101 through signal lines are connected, a one-to-many connection test is required for connections between the LSI 101 and the electronic elements 102a-102d.

In performing a one-to-may connection test between the LSI 101 and the electronic elements 102a-102d, there is proposed a technique in which testing loop-back devices (hereinafter called connection test devices) 105a-105d, which returns as a response signal a signal inputted as a response signal, are connected one for each of the connectors 103a-103d to substitute for the electronic elements 102a-102d as depicted in FIG. 7.

The JTAG circuit 100 outputs a test signal to a number of connection test devices 105a-105d through signal lines a1-a4 and verifies the state of connections between then LSI 101 and the connection test devices 105a-105d from whether or not a signal identical with the output signal returns to the JTAG circuit 100 through signal lines b1-b4.

Here, the state of connections between the LSI 101 and a number of connection test devices 105a-105d represents whether or not the state of a connection between the printed circuit board and each connector is normal and/or whether or not a number of nets (i.e., signal lines a1-a4 and b1-b4 that connects the LSI 101 to the connectors 103a-103d) of connectors 103a-103d are normally connected.

However, if one of the connectors 103a-103d is abnormal (due to failure) when a connection test is performed on the LSI 101 on which the connection test devices 105a-105d are connected all the connectors 103a-103d, the LSI 101 receives a response signal identical to the output test signal and therefore does not detect the abnormality.

Similarly, if one or more of the signal lines a1-a4 and b1-b4 are abnormal due to disconnection or the like but at least one pair of signal lines a1 and b1, signal lines a2 and b2, signal lines a3 and b3, and signal lines a4 and b4 are normal, the LSI 101 receives a response signal the same as the output test signal and therefore does not detect the abnormality.

For another method for a one-to-many connection test between the LSI 101 and the electronic elements 102a-102d, a single connection test device 105a is sequentially connected to one of the connectors 103a-103d to carry out connections of the connectors 103a-103d one at a time.

However, the operator sequentially connects the connection test device 105a to each of the connectors 103a-103d to change connectors 103a-103d to be tested. That requires a large amount labor by the operator and a large time for the test.

In addition, since the operator connects the connection test device 105a to each of the connectors 103a-103d by hand, there is a possibility in occurrence of a human error such as forgetting to test one of the connectors 103a-103d but the operator believes that the all the connectors each have been connected and tested, or connecting and testing one the same connectors twice. Moreover, such an error cannot be automatically detected and therefore there is possibility that the test for all connectors 103a-103d cannot be accomplished.

SUMMARY

There is provided a test apparatus for testing connections formed on a printed circuit board having a plurality of connectors in respect of the plurality of connectors and to a plurality of nets each of which includes one of the plurality of connectors, the test apparatus including: a plurality of connection test devices, each of which is connected to one of the plurality of connectors and each of which switches an operation mode between a first mode in which a response signal is output in response to an input signal, and a second mode in which the response signal in not output; a signal generating circuit, formed on the printed circuit board and generating a connection test signal that is to be input as the input signal into the plurality of connection test devices through the plurality of connectors; a controlling section, controlling each of the plurality of connection test devices to switch the operation mode between the first mode and the second mode such that a first connection test device which is one of the plurality of connection test devices is in the first mode and the remaining connection test devices are in the second mode, and controlling the signal generating circuit to output the connection test signal; and a judging section judging, on the basis of the response signal that the first connection test device being in the first mode outputs in response to the connection test signal, a state of connection of a first connector which is connected to the first connection test device and which is one of the plurality of connectors and a first net including the first connector among the plurality of nets.

It is preferable that the plurality of connection test devices are configured to output, if being in the first mode, the response signal identical with the input signal; and the judging section judges, if the response signal output from the first connection test device is identical with the connection test signal, that the states of connections of the first connector and the first net including the first connector are normal while judges, if the response signal is not identical with the connection test signal, that the states of connections of the first connector and the first net including the first connector are abnormal.

Additionally, it is preferable that each of the connection test devices comprises a three-state buffer configured to switch, on the basis of a switch controlling signal from the controlling section, the operation mode between the first mode in which the response signal on a high level or a low level is output in response to the input signal and the second mode in which the three-state buffer has a high impedance not to output the response signal.

Further, each of the connection test devices preferably includes an I2C (Inter Integrated Circuit) element through which the switch controlling signal is input from the controlling section into the three-state buffer.

It is preferable that the controlling section sequentially changes the first connection test device being in the first mode, so that the states of connections of the plurality of connectors and the plurality of nets are judged.

Preferably, the signal generating circuit may include a JTAG (Joint Test Action Group) circuit which is mounted on the printed circuit board and which has a boundary scan architecture for a board test. In addition, the controlling section is preferably included in a tester that performs the board test in cooperation with the JTAG circuit and that is connected to the JTAG circuit.

Further, the judging section is included in the tester.

It is preferable that the response signal from each of the connection test devices is output through the JTAG circuit to the judging section.

To accomplish the above object, there is provided a method for testing connections formed on a printed circuit board having a plurality of connectors in respect of the plurality of connectors and to a plurality of nets each of which includes one of the plurality of connectors, comprising: connecting each of a plurality of connection test devices, which switches an operation mode between a first mode in which a response signal is output in response to an input signal and a second mode in which the response signal in not output, to one of the plurality of connectors; switching an operation mode of each of the plurality of connection test devices between the first mode and the second mode such that a first connection test device which is one of the plurality of connection test devices is in the first mode and the remaining connection test devices are in the second mode; outputting a connection test signal as the input signal to each of the connection test devices from the circuit board through the connector connected thereto; judging, on the basis of the response signal that the first connection test device being in the first mode outputs in response to the connection test signal, a state of connection of a first connector which is connected to the first connection test device and which is one of the plurality of connectors and a first net including the first connector among the plurality of nets.

It is preferable that the plurality of connection test devices are configured to output, if being in the first mode, the response signal identical with the input signal; and the step of judging judges, if the response signal output from the first connection test device is identical with the connection test signal, that the states of connections of the first connector and the first net including the first connector are normal while judges, if the response signal is not identical with the connection test signal, that the states of connections of the first connector and the first net including the first connector are abnormal.

It is preferable that each of the connection test devices includes a three-state buffer configured to switch, on the basis of a switch controlling signal, the operation mode between the first mode in which the response signal on a high level or a low level is output in response to the input signal and the second mode in which the three-state buffer has a high impedance not to output the response signal.

Further, each of the connection test devices preferably includes an I2C (Inter Integrated Circuit) element through which the switch controlling signal is input from the controlling section into the three-state buffer.

It is preferable that the method further includes sequentially changing the first connection test device being in the first mode, so that the states of connections of the plurality of connectors and the plurality of nets are judged.

In addition, it is preferable that the connection test signal is generated and output by a JTAG (Joint Test Action Group) circuit which is mounted on the printed circuit board and which has a boundary scan architecture for a board test.

It is preferable that the steps of switching and outputting is controlled by a tester which is connected to the JTAG circuit and which performs the board test in cooperation with the JTAG circuit and that the tester judges, on the basis of the response signal from the first connection test device being in the first mode, the states of connections of the first connector and the first net.

Further preferably, the response signal from each of the connection test devices may be output through the JTAG circuit to the tester.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF REFERENCE NUMBERS

Figure 1:
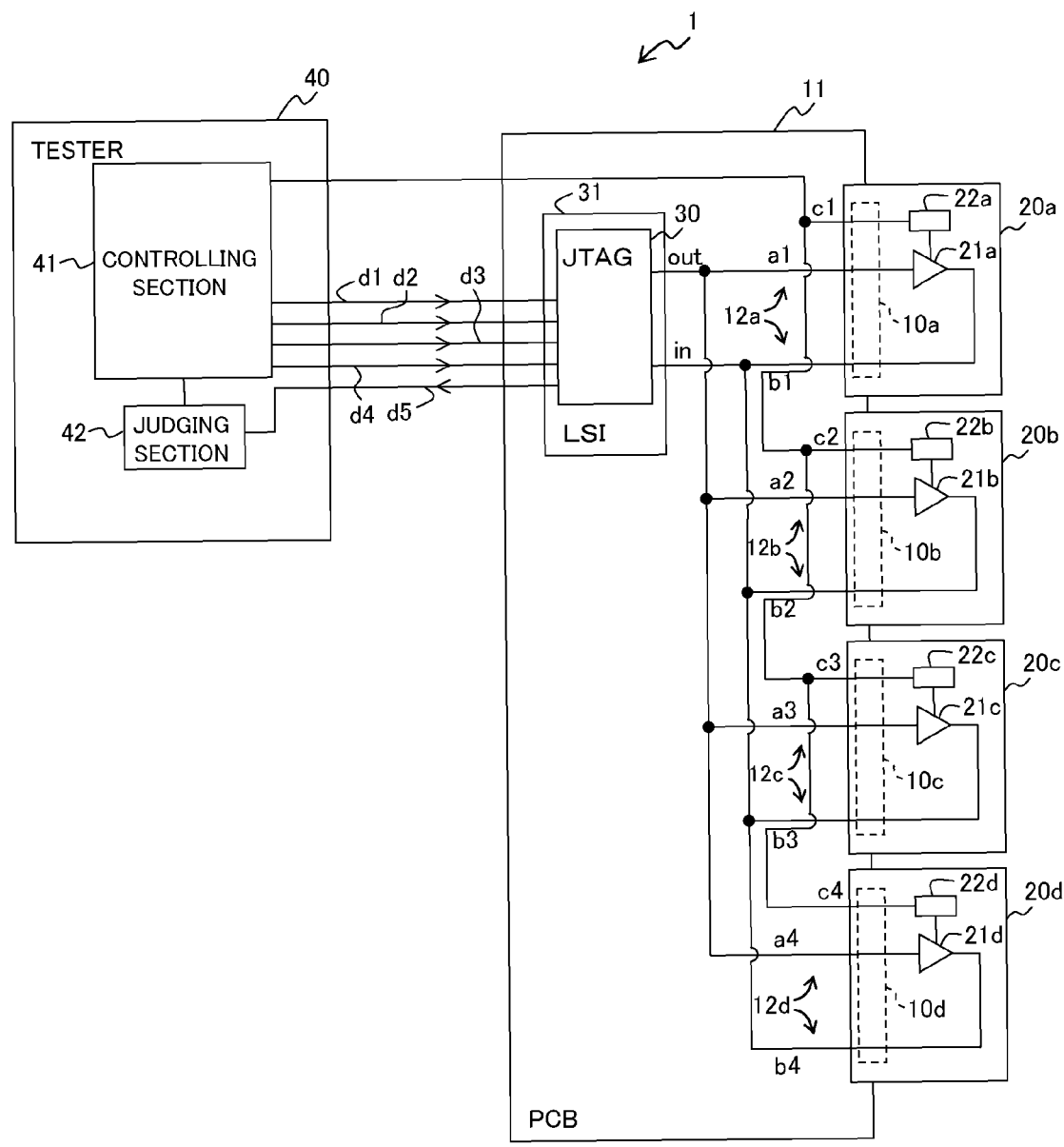
FIG. 1 is a block diagram schematically depicting the entire configuration of a PCB connection test apparatus according to a first embodiment.

1 PCB connection test apparatus
10a-10d, 23a-23d, 103a-103d connector
11, 104 printed circuit board (PCB)
12a-12d net
20a-20d, 105a-105d connection test device
21a-21d three-state buffer
22a-22d I2C (Inter Integrated Circuit) element
30, 100 JTAG (Joint Test Action Group) circuit (signal generating circuit)
31, 101 LSI (Large Scale Integration)
40 tester
41 controlling section
42 judging section
102a-102d electronic part
a1-a4, b1-b4, c1-c4, d1-d5, e1-e4, f1-f4, g1-g4 signal line

DESCRIPTION OF EMBODIMENTS

Hereinafter, an embodiment will now be described with reference to the drawings.

(1) First Embodiment

The entire configuration of a PCB connection test apparatus 1 according to the first embodiment will now be detailed with reference to block diagram FIG. 1.

The PCB connection test apparatus 1 carries out a test for connections formed on a printed board circuit (hereinafter called PCB) 11 equipped with a number (four in the present invention, to which however the number is not limited) of connectors 10a-10d with respect to connections of the connectors 10a-10d and/or connections of nets 12a-12d one including each of the connectors 10a-10d. As depicted in FIG. 1, the PCB connection test apparatus 1 includes: a number of connection test devices 20a-20d each of which is connected to one of the connectors 10a-10d and each of which can switch the operation mode thereof between a first mode (an ENABLE state) in which a response signal is output in response to an input signal and a second mode (a DISABLE state) in which such a response signal is not output; a JTAG (Joint Test Action Group) circuit (depicted "JTAG" in drawings, signal generating circuit) 30 which is formed on the PCB 11 and which generates a connection test signal that is to be input into the connection test devices 20a-20d respectively through connectors 10a-10d; and a tester 40 which controls each of the connection test device 20a-20d to switch the operation mode and which controls the JTAG circuit 30 to output a connection test signal and which judges the states of connections of the connectors 10a-10d and the nets 12a-12d. The tester 40 performs connection test for each of signal lines c1-c4 that are detailed below concurrently with a connection test for the connectors 10a-10d and/or the nets 12a-12d.

The connection test devices 20a-20d (hereinafter represented by reference number "20" if the connection test devices 10a-10d do not have to be one another discriminated) include a three state buffers 21a-21d and I2C (Inter Integrated Circuit) elements 22a-22d.

The connection test devices 20a-20d are each associated with one having the same alphabet on the right of the three-state buffers 21a-21d (hereinafter represented by reference number "21" if the three-state buffers 21a-21d do not have to be one another discriminated) and with one having the same alphabet on the right of the I2C elements 22a-22d (hereinafter represented by reference number "22" if the I2C elements 22a-22d do not have to be one another discriminated). Specifically, the connection test device 20a includes the three-state buffer 21a and the I2C element 22a; the connection test device 20b includes the three-state buffer 21b and the I2C element 22b; the connection test device 20c includes the three-state buffer 21c and the I2C element 22c; and the connection test device 20d includes the three-state buffer 21d and the I2C element 22d.

Each three-state buffer 21 switches, on the basis of a switching control signal from a tester 40 (more specifically from a controlling section 41 that is detailed below), the operation mode between the first mode in which a response signal on a high level or a low level is output in response to a connection test signal (input signal from the JTAG circuit 30) and the second mode in which the three-state buffer 21 has a high impedance not to output the response signal.

In the first mode, the three-state buffer 21 outputs the response signal identical with the connection test signal inputted therein input as the input signal. In detail, if a connection test signal input as the input signal is on the high level (represented by "1"), the three-state buffer 21 outputs a signal on the high level as a response signal while, if a connection test signal input as the input signal is on the low level (represented by "0"), the three-state buffer 21 outputs a signal on the low level as a response signal.

Here, assuming that the three-state buffer 21a (the connection test device 20a) is in the first mode, a connection test signal output from the JTAG circuit 30 is input into the three-state buffer 21a included in the connection test device 20a through a signal line a1 and a connector 10a and the three-state buffer 21a output a response signal identical with the input connection test signal, which is input into the JTAG circuit 30 through the connector 10a and a signal line b1 and further input into the tester 40 (specifically, into a judging section 42 to be detailed below).

On the contrary, when the three-state buffer 21a (the connection test device 20a) is in the second mode, a connection test signal output from the JTAG circuit 30 is input into the three-state buffer 21a in the connection test device 20a through the signal line a1 and the connector 10a, but the three-state buffer 21a does not output a response signal because the three-state buffer 21a has a high impedance to be electronically disconnected from the JTAG circuit 30.

When the three-state buffers 21b-21d are in the first mode and the second mode, the three-state buffers 21b-21d carry out the same operations as those carried out by the three-state buffer 21a.

A switch controlling signal which the tester 40 outputs to switch the operation mode of a three-state buffer 21 between the first mode and the second mode is input into the three-state buffer 21 through the associated I2C element 22.

In the illustrated example, a switch controlling signal from the tester 40 (from the controlling section 41 that is to be detailed below) is input through a signal line c1 into the I2C element 22a included in the connection test device 20a; input through a signal line c2 into the I2C element 22b included in the connection test device 20b; input through a signal line c3 into the I2C element 22c included in the connection test device 20c; and input through a signal line c4 into the I2C element 22d included in the connection test device 20d.

Figure 2:
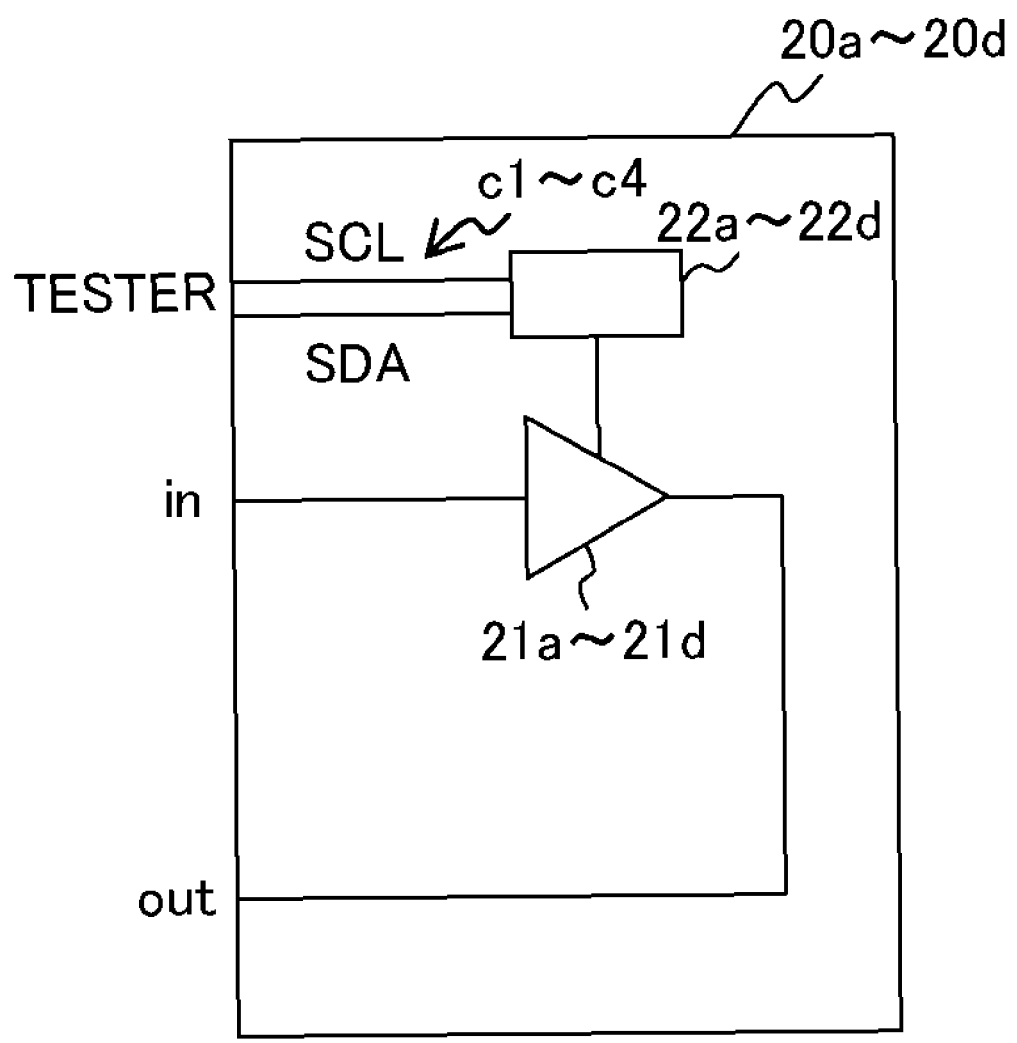
FIG. 2 is a block diagram schematically depicting the detailed configuration of an I2C element included in a connection test device included in a test apparatus of the first embodiment.

As depicted in FIG. 2, the I2C element 22 can set an output value (i.e., a signal to switch the operation mode of the three-state buffer 21 between the two modes) to the three-state buffer 21 by the use of two signals of SCL (Serial Clock) and SDA (Serial DAta).

In addition, one of the best advantages of the use of the I2C element 22 is that all the I2C elements 22a-22d can be controlled through the use of only two signals. For the above, with the I2C elements 22a-22d for the connection test devices 20a-20d, it is sufficient that the tester 40 outputs two signals of SCL and SDA as a switch controlling signal to the I2C elements 22a-22d, so that the configurations of the tester 40 (the controlling section 41) and the signal lines c1-c4 can be simple.

Further, if a connecting element (such as a memory board) that is to be actually connected to a connector 10 of the PCB 11 originally includes an I2C element, the connector 10 or the PCB 11 originally has a mechanism to input the two signals into the I2C element of the connecting element. With this configuration, a switch controlling signal can be easily input into the I2C element 22 simply by incorporating an I2C element 22 into the connection test device 20 without requiring a new configuration to switch the operation mode of the three-state buffer 21. Consequently, the operation mode of the three-state buffer 21 can be efficiently switched.

Each of the signal lines c1-c4 takes the form of a signal line in FIG. 1 for the sake of simplification of the drawing, but is actually formed from two signal lines to input the two signals into the I2C element 22.

With this configuration, the connection test devices 20 are controlled such that the three-state buffer 21 of one of the connection test devices 20 is in the first mode and the three-state buffers 21 of the remaining connection test devices 20 is in the second mode. As a result, a connection test can be carried out on such a single connection test device 20 being in the first mode.

For example, the connection test that is to be performed on the connection test device 20a can accomplish a connection test for the connector 10a (e.g., judging whether or not the connector 10a is correctly mounted on the PCB 11) and a connection test for the net 12a including the signal lines a1 and b1 in respect of the connector 10a (e.g., whether or not the signal lines are disconnected and damaged) which tests are based on a response signal from the three-state buffer 21a. In the same manner, the connection test that is to be performed on the connection test device 20b can accomplish a connection test for the connector 10b and a connection test for the net 12b including the signal lines a2 and b2 in respect of the connector 10b; the connection test that is to be performed on the connection test device 20c can accomplish a connection test for the connector 10c and a connection test for the net 12c including the signal lines a3 and b3 in respect of the connector 10c; and the connection test that is to be performed on the connection test device 20d can accomplish a connection test for the connector 10d and a connection test for the net 12d including the signal lines a4 and b4 in respect of the connector 10d. These connection tests can also accomplish connection tests for the signal lines c1-c4.

The JTAG circuit 30 is mounted on the PCB 11 and has a boundary scan architecture that carries out a board test. Specifically, the JTAG circuit 30 is mounted inside an LSI 31 on the PCB 11.

The tester 40 carries out a board test in cooperation with the JTAG circuit 30, and includes the controlling section 41 and the judging section 42 so that connection tests are performed for the connectors 10a-10d and/or the nets 12a-12d (hereinafter represented by reference number "12" if the nets 12a-12d do not have to be one another discriminated).

The controlling section 41 controls through the use of a switch controlling signal all the connection test devices 20 to switch the operation modes between the first mode and the second mode such that one of the connection test devices 20 is solely in the first mode, and also controls the JTAG circuit 30 to output a connection test signal.

The controlling section 41 outputs a switch controlling signal to each of the I2C elements 22a-22d so that a connection test device 20 being in the first mode is sequentially altered. Consequently, connection tests can be carried out on each of the connectors 10a-10d and/or the nets 12a-12d.

The judging section 42 judges, on the basis of a response signal that the three-state buffer 21 of the connection test device 20 being in the first mode outputs in response to the connection test signal, the states of connection of the connector 10 connected to the connection test device 20 in question and the net 12 including the same connector 10.

Specifically, a three-state buffer 21 of a connection test device 20 is configured to output a response signal identical to a connection test signal. Therefore, the judging section 42 judges, if the response signal from the connection test device 20 is identical to the connection signal, that the states of connections of the connector 10 and the net 12 including the same connector 10 are normal while judges, if the response signal from the connection test device 20 is different from the connection test signal (including a case where the judging section 42 does not receive the response signal from the connection test device 20 or the response signal does not coincide with the connection test signal), that the states of connections of the connector 10 and the net 12 including the same connector 10 are abnormal.

In the event of a test by the PCB connection test apparatus 1 of the first embodiment, connection tests for the nets 12 on the PCB 11 are sometimes completed. In such a case, since the PCB connection test apparatus 1 carries out a connection test on the assumption that the nets 12 are in a normal state of connection, the judging section 42 makes a judgment only on states of connections of the connectors 10 to the PCB 11.

The controlling section 41 is connected to the JTAG circuit 30 through signal lines d1-d4, through which the controlling section 41 inputs a controlling signal into the JTAG circuit 30 to prompt the JTAG circuit 30 to generate a connection test signal. Responsive to reception of the controlling signal from the controlling section 41, the JTAG circuit 30 generates and output a connection test signal.

The judging section 42 is connected to the JTAG circuit 30 through a signal line d5, through which a response signal from a three-state buffer 21 of a connection test device 20 is input into the judging section 42 via the JTAG circuit 30.

Here, the method for testing a connection on a PCB of the first embodiment will now be described. The method includes the following procedural steps (1) through (4).

(1) The connectors 10 is connected one to each of the connection test devices 20 which are capable of switching the operation mode between the first mode and the second mode.

(2) The controlling section 41 switches the operation mode of each connection test device 20 such that only one of the connection test devices 20 is in the first mode.

(3) The JTAG circuit 30 on the PCB 11, under the control of the controlling section 41, outputs a connection test signal as an input signal into each of the connection test devices 20 through the associated connector 10.

(4) In the final step, the judging section 42 judges the states of connections of the connector 10 connected to the connection test device 20 solely being in the first mode and the net 12 including the same connector 10 on the basis of the response signal that the connection test device 20 being in the first mode outputs in response to the connection test signal.

For example, if a connection test signal output from the JTAG circuit 30 through the signal line a1 is on the high level and the response signal input into the JTAG circuit 30 through the signal line b1 is on the high level (in other words, the signal input into the judging section 42 through the signal line d5 is on the high level) while the connection test device 20*a* (the three-state buffer 21*a*) takes the first mode, the judging section 42 judges the states of connections of the connector 10*a* connected to the connection test device 20*a* and/or the net 12*a* including the connector 10*a* are normal. On the contrary, a connection test signal output from the JTAG circuit 30 through the signal line a1 is on the low level and the response signal input into the JTAG circuit 30 through the signal line b1 is on the low level, the judging section 42 makes the same judgment as the above.

However, if a connection test signal output from the JTAG circuit 30 through the signal line a1 is on the high level while the response signal input into the JTAG circuit 30 through the signal line b1 is on the low level that is, a signal on the low level is input into the judging section 42 through signal line d5, the judging section 42 judges that the states of connections of the connector 10*a* and/or the net 12*a* including the connector 10*a* are abnormal.

At this time, since the connection test devices 20*b*-20*d* are in the second mode to electrically disconnected (from the JTAG circuit 30), a connection test signal is input into the three-state buffers 21*b*-21*d* respectively through the signal lines a2-a4 but the three-state buffers 21*b*-21*d* do not output the response signals respectively through signal lines b2-b4.

When the connection test device 20*b* takes the first mode, the remaining connection test devices 20*a*, 20*c*, and 20*d* take the second mode; when the connection test device 20*c* takes the first mode, the remaining connection test devices 20*a*, 20*b*, and 20*d* take the second mode; and when the connection test device 20*d* takes the first mode, the remaining connection test devices 20*a*-20*c* take the second mode.

As described above, the PCB connection test apparatus 1 (the method for testing connection in respect to a PCB) of the first embodiment of the present invention connects each of connectors 10 to one of the connection test devices 20 which can switch the operation mode thereof between the first mode and the second mode, and the controlling section 41 switches the operation mode of each connection test device 20 such that only one of the connection test devices 20 takes the first mode. In addition, the JTAG circuit 30 outputs a connection test signal as an input signal from the PCB 11 into connection test devices 20 through the connectors 10 under the control of the controlling section 41, and the judging section 42 judges the states of connections of connector 10 of the connection test device 20 being solely in the first mode and the net 12 including the same connector 10 on the basis of the response signal that is output by the connection test device 20 in question in response to the connection test signal. Thereby, one of the connection test device 20 can be easily identified and a connection test only for the connector 10 associated with the identified connection test device 20 can be carried out, so that such a connection test can be accurately carried out on each of the connectors 10, reducing workload on the operator.

In other words, the controlling section 41 controls the connection test devices 20 such that only one of the connection test devices 20 is in the first mode and the remaining connection test devices 20 are in the second mode to be electrically disconnected from the JTAG circuit 30 (i.e., from the tester 40). In this manner, there is no requirement for the operator to disconnect and connect a connection test device 20 so that the connector 10 to be tested is changed one another. The amount of workload on the operator can be greatly reduced, which consequently reduces the time required for the connection test.

In addition, since the controlling section 41 automatically identifies a connector 10 that is to be tested, connections of all the connectors 10 can be surely and accurately tested.

The three-state buffers 21 of the connection test devices 20 are configured to output, when being in the first mode, a response signal identical with a connection test signal (input signal). The judging section 42 judges, if the response signal from a connection test device 20 is identical with the connection test signal, that the state of a connection of the connector 10 is normal while judges, if the response signal is different from the connection test signal, that the state of a connection of the connector 10 is abnormal. As a consequent, the judging section 42 accurately judges the state of a connection of a connector 10 through the use of simple logic.

Further, the controlling section 41 sequentially changes the connection test device 20 being in the first mode so that the connection test is carried out on all the connectors 10, and the connection test for all the connectors 10 can be thereby automatically accomplished.

Since the JTAG circuit 30 which has a boundary scan architecture for a board test and which is mounted on the PCB 11 generates and outputs a connection test signal, there is no requirement for install another circuit to generate a connection test signal and the connection test for each connector 10 can be carried out by use of the JTAG circuit 30, which has been originally mounted for another purpose, reducing the production cost and the space for the test apparatus.

Further, the controlling section 41 and the judging section 42 are included in the tester 40 that performs a board test in cooperation with the use of the JTAG circuit 30, and therefore can be realized by the tester 40 installed for another purpose, eliminating requirement of preparation for new device. This contributes to reduction in the production cost.

(2) Others

The present invention should by no means be limited to the above first embodiment, and various changes and modifications can be suggested without departing from the gist of the present invention.

Figure 3:
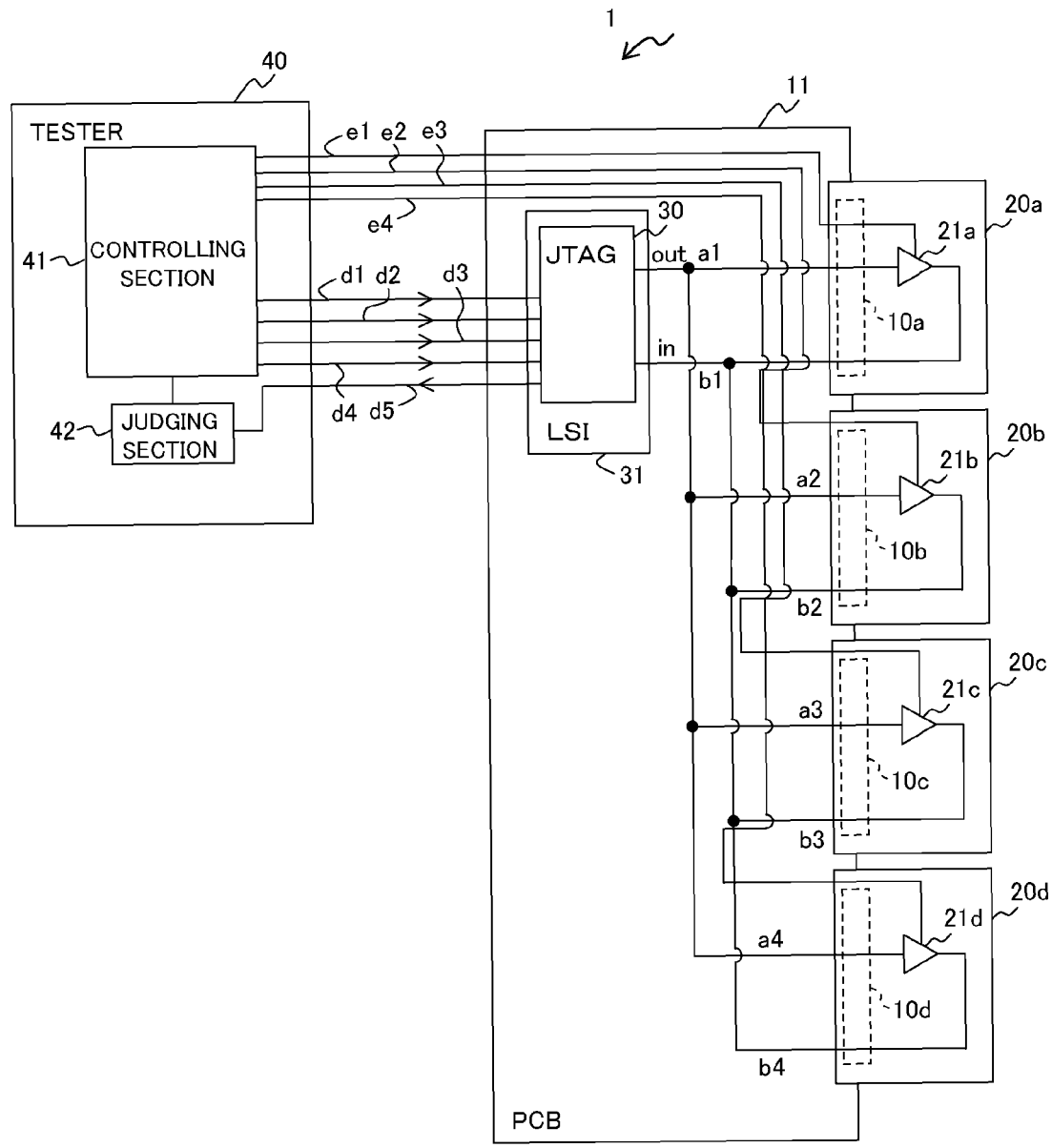
FIG. 3 is a block diagram schematically depicting the entire configuration of PCB connection test apparatus according to a modification of the first embodiment.

For example, each connection test device 20 of the first embodiment has an I2C element 22, but the present invention is not limited to this. Alternatively, as depicted in FIG. 3, each connection test device 20 may have no I2C element 22 and the controlling section 41 included in the tester 40 may directly input a switch controlling signal into the three-state buffers 21 of the connection test device 20 through signal lines e1-e4 so that the operation modes are switched. This configuration can provide the same effects as the first embodiment.

Figure 4:
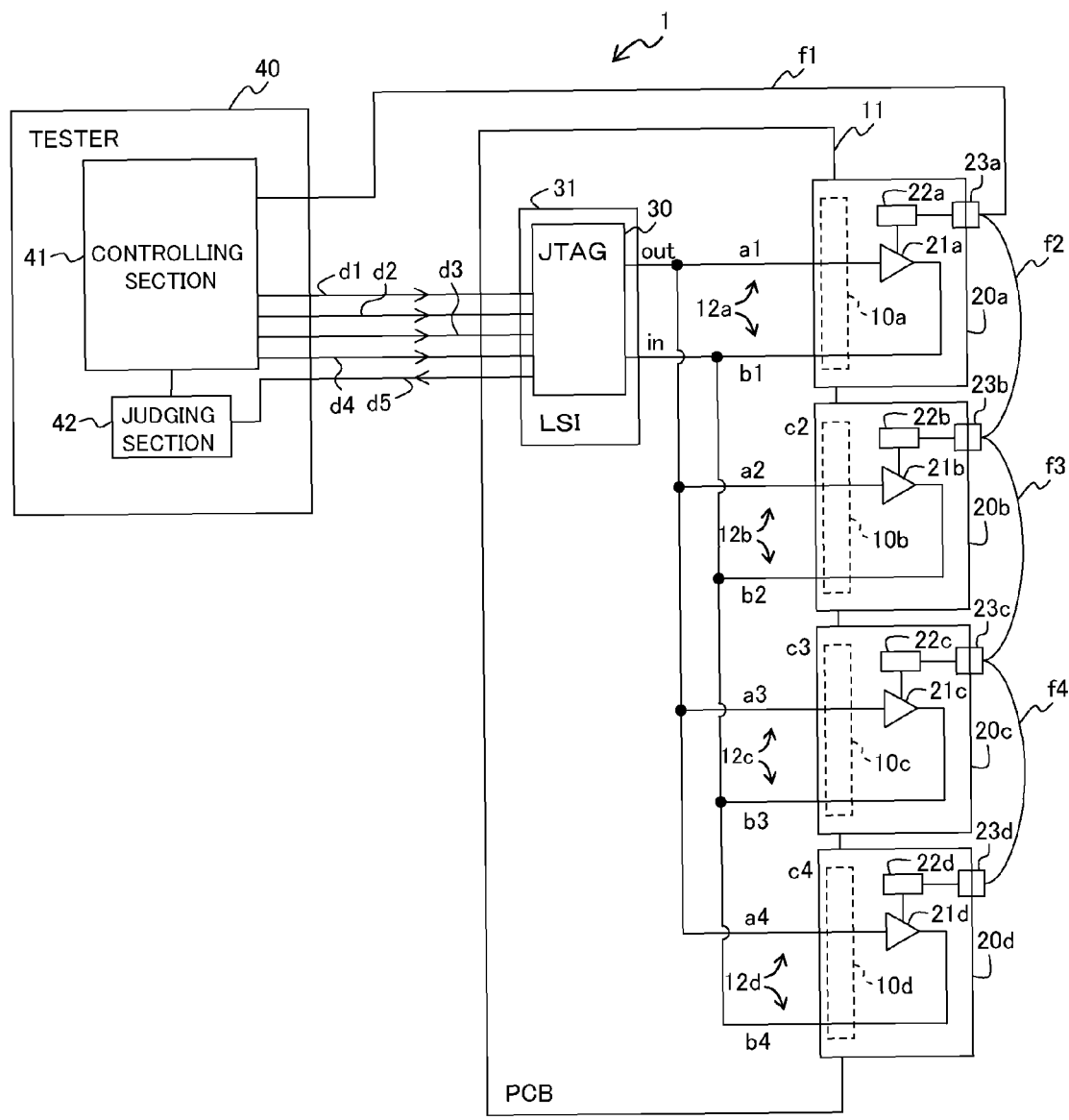
FIG. 4 is a block diagram schematically depicting the entire configuration of a PCB connection test apparatus according to another modification of the first embodiment.

Further, the switch controlling signal from the controlling section 41 is input into I2C elements 22 through the connectors 10 disposed on the PCB 11 in the first embodiment. However, the present invention is not limited to this. Alternatively, as depicted in FIG. 4, connectors 23a-23d may be respectively formed on the connection test devices 20a-20d so that a switch controlling signal from the controlling section 41 is directly input into the I2C elements 22a-22d of the connection test devices 20a-20d through signal lines f1-f4 outside the PCB 11 and through the connectors 23a-23d. This configuration can provide the same effects as the first embodiment. Even if an element that is to be actually connected to a connector 10 does not include an I2C element and the PCB 11 cannot deal with the I2C element, the combination of and I2C element 22 and two signals can switch the operation modes of the three-state buffers 21 in all the connection test devices 20. As a consequence, the configuration of the apparatus can be simple.

Figure 5:
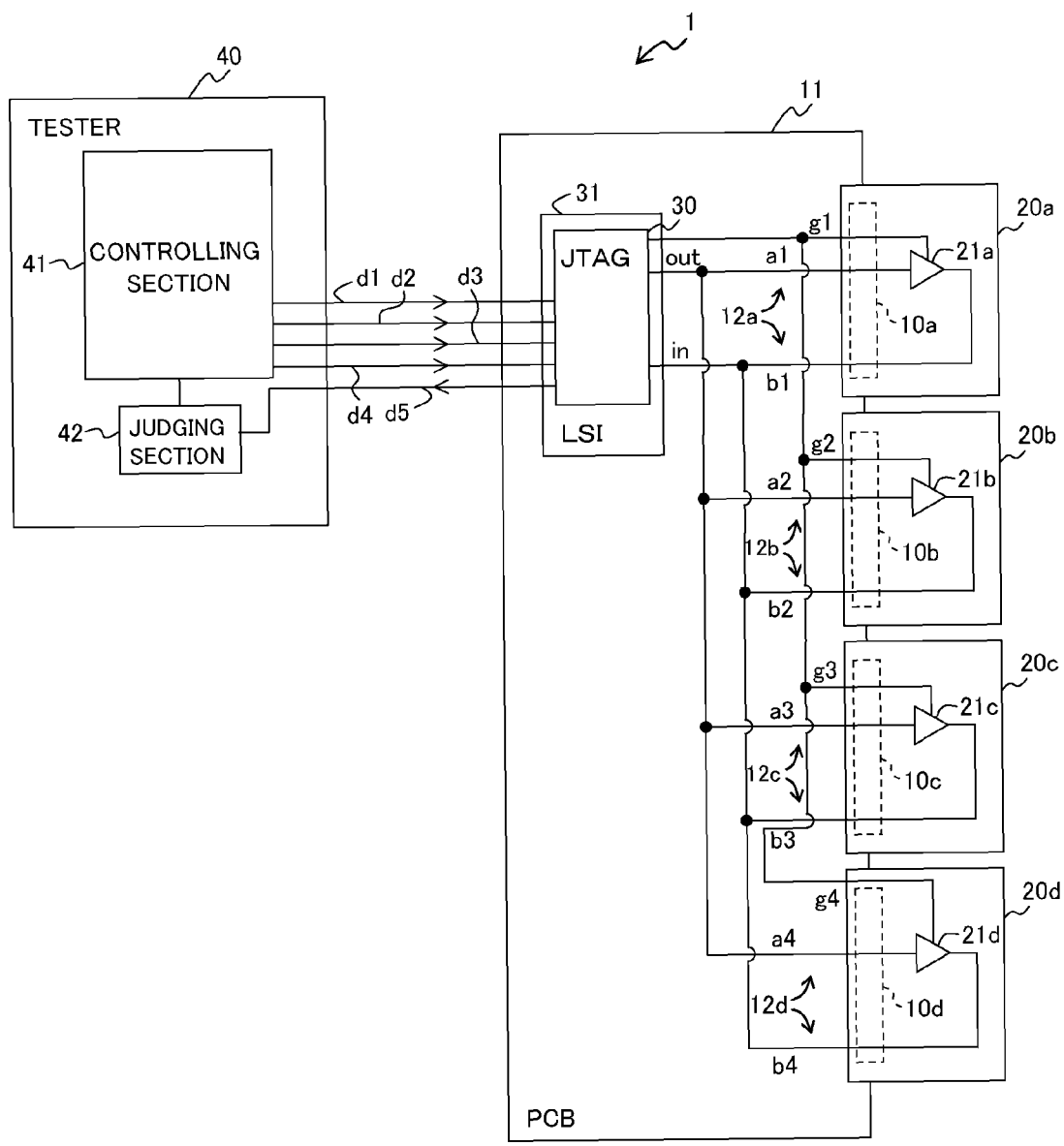
FIG. 5 is a block diagram schematically depicting the entire configuration of a PCB connection test apparatus according to an additional modification of the first embodiment.
Figure 6:
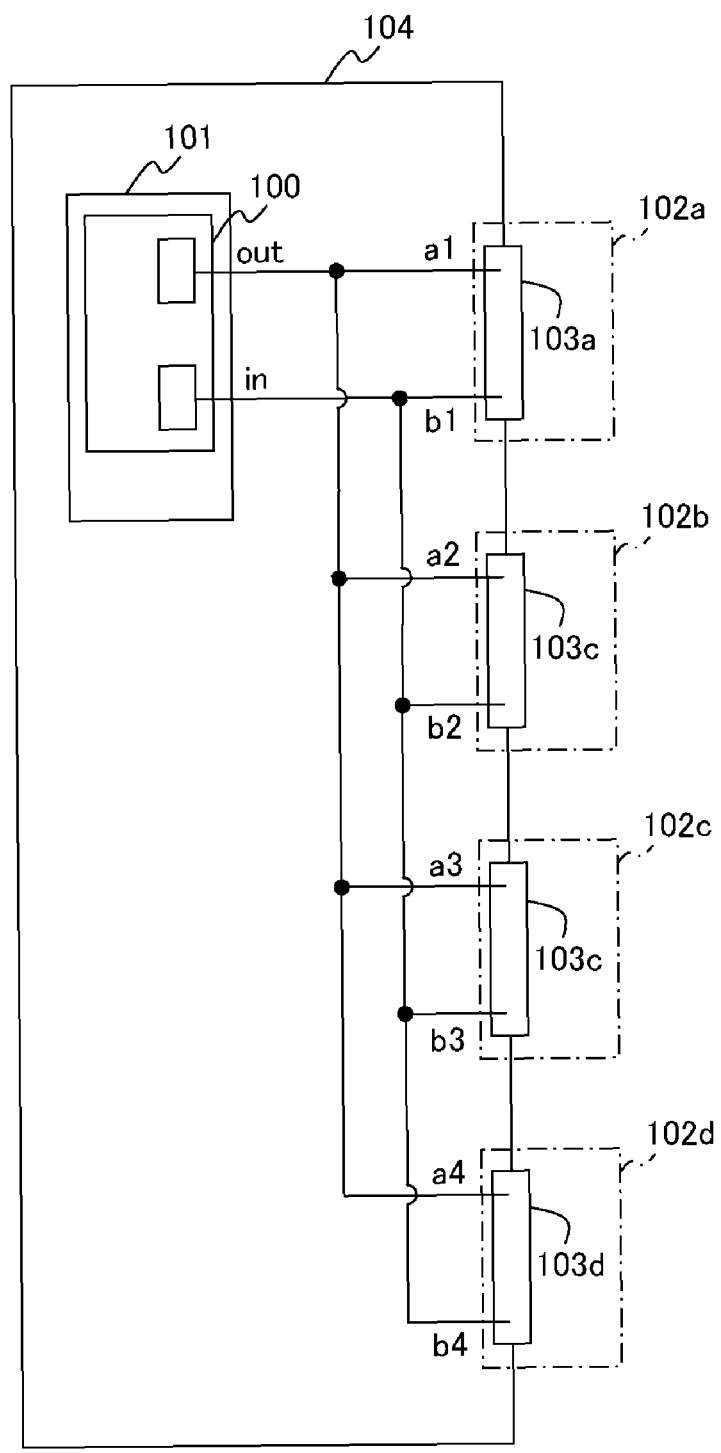
FIG. 6 is a diagram schematically depicting the printed circuit board having a number of connectors.
Figure 7:
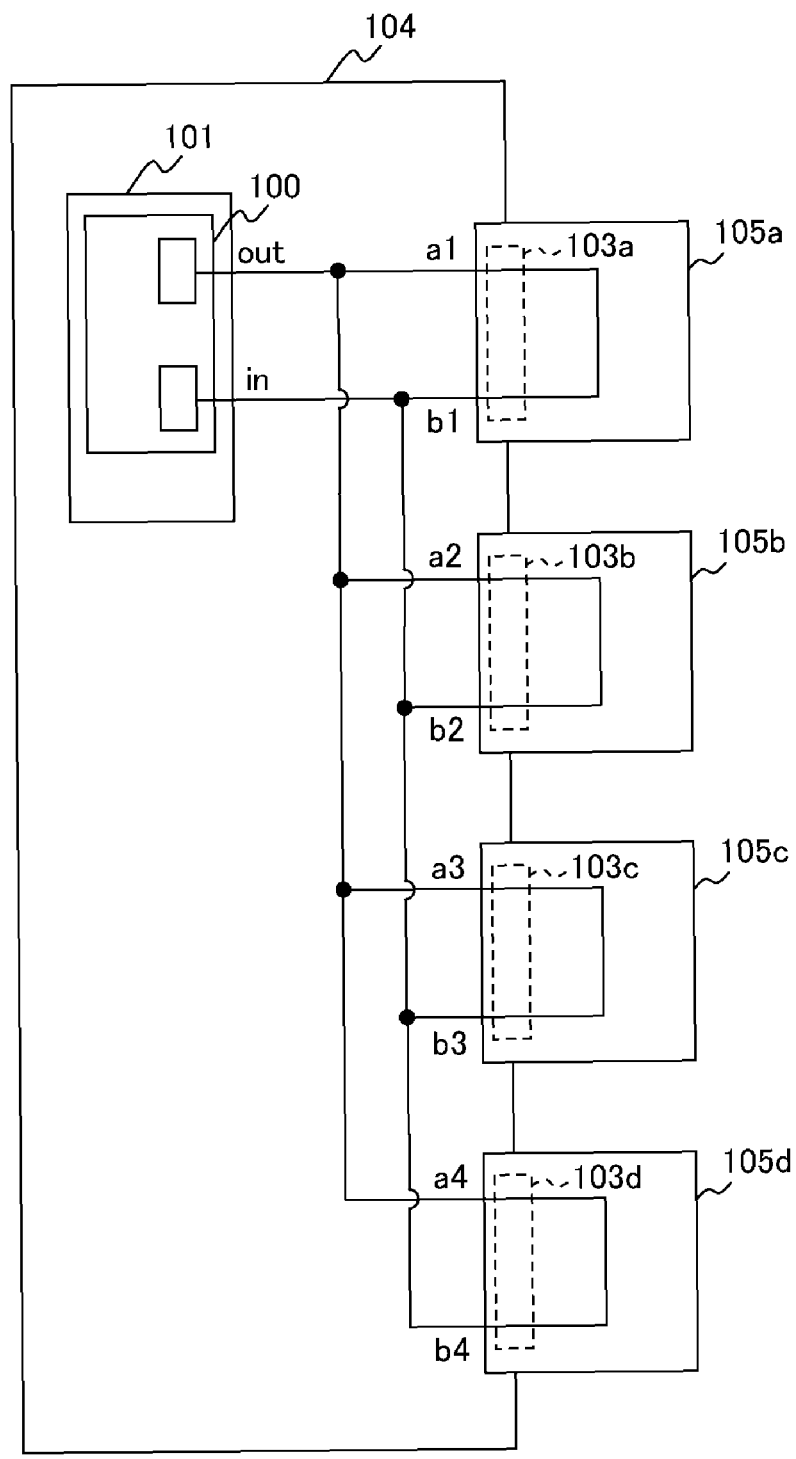
FIG. 7 is a diagram depicting an example of a conventional connection test performed on the printed circuit board of FIG. 6.
Figure 8:
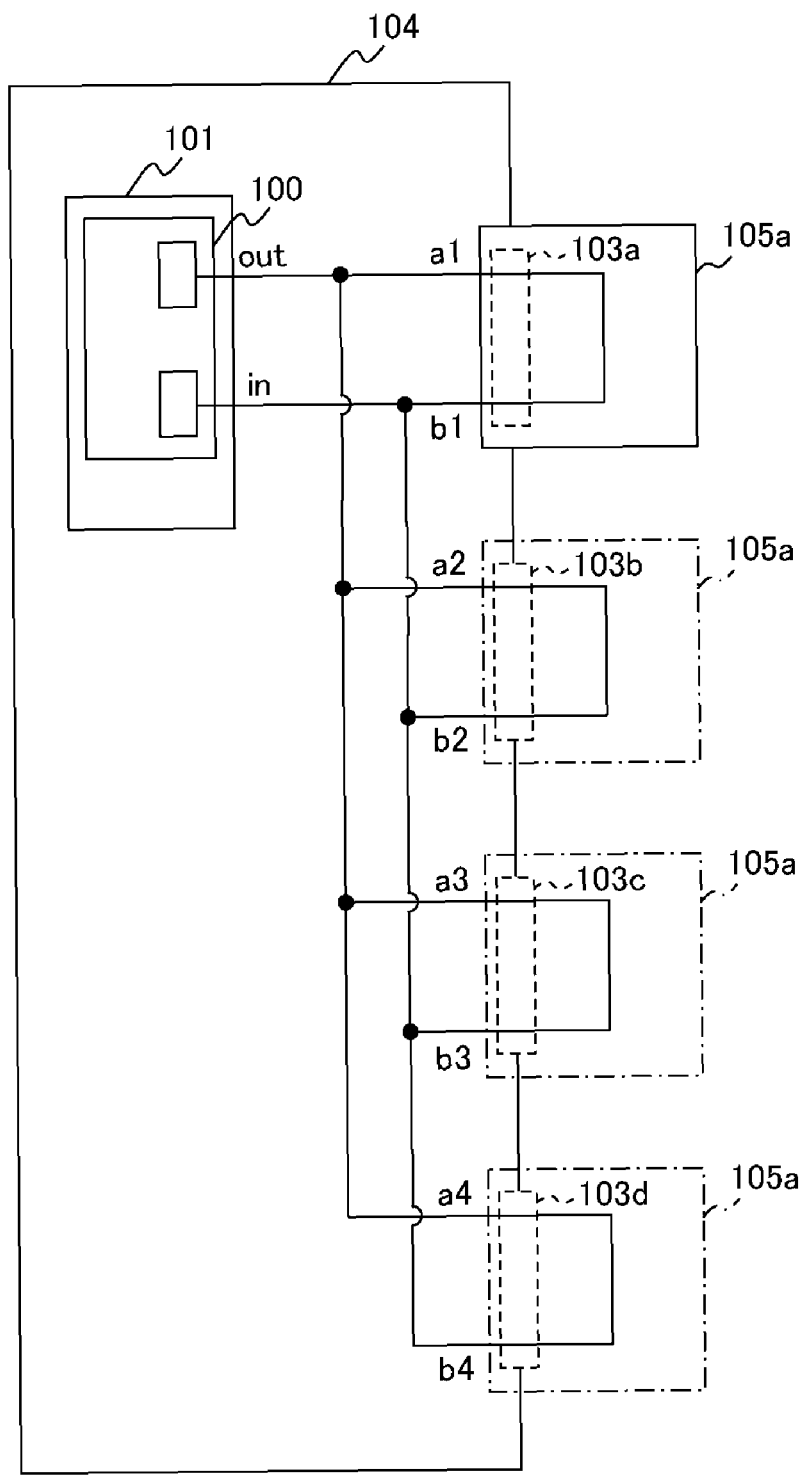
FIG. 8 is a diagram depicting an example of a conventional connection test performed on the printed circuit board of FIG. 6.

In the above description, the first embodiment assumes that the controlling section 41 of the tester 40 outputs a switch controlling signal for switching the operation mode of the three-state buffer 21 included in each connection test device 20. However, the present invention is not limited to this. Alternatively, the JTAG circuit 30 may output a switch controlling signal through signal lines g1-g4 as depicted in FIG. 5. Specifically, a signal output from the JTAG circuit 30 to the connectors 10 may be used as a switch controlling signal that controls the three-state buffers 21 to switch the operation modes. Consequently, the alternative can obtain the same effects as the first embodiment.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has (have) been described in detail, it should be understood that the various changes, substitutions, and alterations could be made hereto without departing from the spirit and scope of the invention.

What is claimed is:

1. A test apparatus for testing connections formed on a printed circuit board having a plurality of connectors in respect of the plurality of connectors and to a plurality of nets each of which includes one of the plurality of connectors, said test apparatus comprising:
    a plurality of connection test devices, each of which is connected to one of the plurality of connectors and each of which switches an operation mode between a first mode in which a response signal is output in response to an input signal, and a second mode in which the response signal in not output when the connections of the plurality of connectors and the plurality of nets are being tested;
    a signal generating circuit, formed on the printed circuit board and generating a connection test signal that is to be input as the input signal into said plurality of connection test devices through the plurality of connectors;
    a controlling section, controlling each of said plurality of connection test devices to switch the operation mode between the first mode and the second mode such that a first connection test device which is one of said plurality of connection test devices is in the first mode and the remaining connection devices are in the second mode, and controlling said signal generating circuit to output the connection test signal; and
    a judging section judging, on the basis of the response signal that the first connection test device being in the first mode outputs in response to the connection test signal, a state of connection of a first connector which is connected to the first connection test device and which is one of the plurality of connectors and a first net including the first connector among the plurality of nets.

2. A test apparatus according to claim 1, wherein:
    said plurality of connection test devices are configured to output, if being in the first mode, the response signal identical with the input signal; and
    said judging section judges, if the response signal output from the first connection test device is identical with the connection test signal, that the states of connections of the first connector and the first net including the first connector are normal while judges, if the response signal is not identical with the connection test signal, that the states of connections of the first connector and the first net including the first connector are abnormal.

3. A test apparatus according to claim 1, wherein each said connection test device comprises a three-state buffer configured to switch, on the basis of a switch controlling signal from said controlling section, the operation mode between the first mode in which the response signal on a high level or a low level is output in response to the input signal and the second mode in which the three-state buffer has a high impedance not to output the response signal.

4. A test apparatus according to claim 3, wherein each said connection test device further comprises an I2C (Inter Integrated Circuit) element through which the switch controlling signal is input from said controlling section into said three-state buffer.

5. A test apparatus according to claim 1, wherein said controlling section sequentially changes the first connection test device being in the first mode, so that the states of connections of the plurality of connectors and the plurality of nets are judged.

6. A test apparatus according to claim 1, wherein said signal generating circuit comprises a JTAG (Joint Test Action Group) circuit which is mounted on said printed circuit board and which has a boundary scan architecture for a board test.

7. A test apparatus according to claim 6, wherein said controlling section is included in a tester that performs the board test in cooperation with said JTAG circuit and that is connected to said JTAG circuit.

8. A test apparatus according to claim 7, wherein said judging section is included in the tester.

9. A test apparatus according to claim 6, wherein the response signal from each said connection test device is output through said JTAG circuit to said judging section.

10. A method for testing connections formed on a printed circuit board having a plurality of connectors in respect of the plurality of connectors and to a plurality of nets each of which includes one of the plurality of connectors, comprising:
    connecting each of a plurality of connection test devices, which switches an operation mode between a first mode in which a response signal is output in response to an input signal and a second mode in which the response signal in not output, to one of the plurality of connectors when the connections of the plurality of connectors and the plurality of nets are being tested;

switching an operation mode of each of said plurality of connection test devices between the first mode and the second mode such that a first connection test device which is one of said plurality of connection test devices is in the first mode and the remaining connection test devices are in the second mode;

outputting a connection test signal as the input signal to each said connection test device from the circuit board through the connector connected to each said connection test device;

judging, on the basis of the response signal that the first connection test device being in the first mode outputs in response to the connection test signal, a state of connection of a first connector which is connected to the first connection test device and which is one of the plurality of connectors and a first net including the first connector among the plurality of nets.

11. A method for testing connections according to claim 10, wherein:

said plurality of connection test devices are configured to output, if being in the first mode, the response signal identical with the input signal; and the step of judging judges, if the response signal output from the first connection test device is identical with the connection test signal, that the states of connections of the first connector and the first net including the first connector are normal while judges, if the response signal is not identical with the connection test signal, that the states of connections of the first connector and the first net including the first connector are abnormal.

12. A method for testing connections according to claim 10, wherein each said connection test device comprises a three-state buffer configured to switch, on the basis of a switch controlling signal, the operation mode between the first mode in which the response signal on a high level or a low level is output in response to the input signal and the second mode in which the three-state buffer has a high impedance not to output the response signal.

13. A method for testing connections according to claim 12, wherein each said connection test device further comprises an I2C (Inter Integrated Circuit) element through which the switch controlling signal is input into said three-state buffer.

14. A method for testing connections according to claim 10, further comprising sequentially changing the first connection test device being in the first mode, so that the states of connections of the plurality of connectors and the plurality of nets are judged.

15. A method for testing connections according to claim 10, wherein the connection test signal is generated and output by a JTAG (Joint Test Action Group) circuit which is mounted on the printed circuit board and which has a boundary scan architecture for a board test.

16. A method for testing connections according to claim 15, wherein the steps of switching and outputting is controlled by a tester which is connected to the JTAG circuit and which performs the board test in cooperation with the JTAG circuit.

17. A method for testing connections according to claim 16, wherein the tester judges, on the basis of the response signal from the first connection test device being in the first mode, the states of connections of the first connector and the first net.

18. A method for testing connections according to claim 15, wherein the response signal from each said connection test device is output through the JTAG circuit to the tester.

* * * * *